(12) United States Patent
Ha

(10) Patent No.: US 11,456,252 B2
(45) Date of Patent: Sep. 27, 2022

(54) SEMICONDUCTOR DEVICE HAVING SYMMETRIC CONDUCTIVE INTERCONNECTION PATTERNS

(71) Applicant: SK hynix Inc., Icheon (KR)

(72) Inventor: Tae-Jung Ha, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 31 days.

(21) Appl. No.: 17/189,839

(22) Filed: Mar. 2, 2021

(65) Prior Publication Data

US 2021/0183769 A1 Jun. 17, 2021

Related U.S. Application Data

(62) Division of application No. 16/358,661, filed on Mar. 19, 2019, now abandoned.

(30) Foreign Application Priority Data

Jul. 24, 2018 (KR) .......................... 10-2018-0085972

(51) Int. Cl.
*H01L 21/768* (2006.01)
*H01L 23/528* (2006.01)
(Continued)

(52) U.S. Cl.
CPC ...... *H01L 23/5283* (2013.01); *H01L 21/0214* (2013.01); *H01L 21/0217* (2013.01); *H01L 21/02164* (2013.01); *H01L 21/02271* (2013.01); *H01L 21/31053* (2013.01); *H01L 21/31144* (2013.01); *H01L 21/3212* (2013.01); *H01L 21/32131* (2013.01); *H01L 21/7684* (2013.01);
(Continued)

(58) Field of Classification Search
CPC ......... H01L 21/76883; H01L 21/76885; H01L 21/76837
See application file for complete search history.

(56) References Cited

U.S. PATENT DOCUMENTS 5,994,779 A 11/1999 Gardner et al.
6,140,217 A 10/2000 Jones et al.
(Continued)

FOREIGN PATENT DOCUMENTS

WO 2018111289 A1 6/2018

*Primary Examiner* — Daniel Luke

(57) ABSTRACT

A method for fabricating a semiconductor device may include forming a stopper layer; forming an intermediate pattern material layer over the stopper layer; forming a plurality of first preliminary intermediate patterns by patterning the intermediate pattern material layer; forming a plurality of second preliminary intermediate patterns by shrinking the first preliminary intermediate patterns; forming a conductive material layer to cover the second preliminary intermediate patterns; forming a plurality of preliminary conductive interconnection patterns by patterning the conductive material layer; forming a filling layer between the preliminary conductive interconnection patterns; and forming a plurality of intermediate patterns, a plurality of conductive interconnection patterns and a plurality of filling patterns by removing top portions of the filling layer, the preliminary conductive interconnection patterns and the second preliminary intermediate patterns.

20 Claims, 15 Drawing Sheets

(51) Int. Cl.
*H01L 21/02* (2006.01)
*H01L 21/3213* (2006.01)
*H01L 21/321* (2006.01)
*H01L 21/3105* (2006.01)
*H01L 21/311* (2006.01)
*H01L 23/532* (2006.01)

(52) U.S. Cl.
CPC .. *H01L 21/76802* (2013.01); *H01L 21/76819* (2013.01); *H01L 21/76837* (2013.01); *H01L 21/76843* (2013.01); *H01L 21/76877* (2013.01); *H01L 21/76883* (2013.01); *H01L 21/76885* (2013.01); *H01L 23/53266* (2013.01)

(56) References Cited

U.S. PATENT DOCUMENTS

| | | | |
|---|---|---|---|
| 7,052,932 | B2 | 5/2006 | Huang et al. |
| 8,314,036 | B2 | 11/2012 | Moon et al. |
| 8,492,282 | B2 * | 7/2013 | DeVilliers ......... H01L 21/32139 |
| | | | 438/694 |
| 8,541,306 | B2 | 9/2013 | Yang et al. |
| 8,778,794 | B1 * | 7/2014 | Singh ................ H01L 21/76843 |
| | | | 438/643 |
| 8,836,005 | B2 | 9/2014 | Yang et al. |
| 9,558,999 | B2 | 1/2017 | Li et al. |
| 10,128,188 | B2 | 11/2018 | Adusumilli et al. |
| 10,615,117 | B2 | 4/2020 | Lin et al. |
| 11,164,753 | B2 * | 11/2021 | Li ...................... H01L 21/0337 |
| 2020/0098629 | A1 | 3/2020 | Lin et al. |

\* cited by examiner

SEMICONDUCTOR DEVICE HAVING SYMMETRIC CONDUCTIVE INTERCONNECTION PATTERNS

CROSS-REFERENCE TO RELATED APPLICATIONS

The patent application is a divisional application of a U.S. patent application Ser. No. 16/358,661, filed on Mar. 19, 2019, which claims priority under 35 U.S.C. § 119 of Korean Patent Application No. 10-2018-0085972, filed on Jul. 24, 2018, which is incorporated herein by reference in its entirety.

TECHNICAL FIELD

The technology and implementations disclosed in this patent document relate to symmetric conductive interconnection patterns having smaller widths and/or spaces than widths and/or spaces of mask patterns formed in a photolithography process, and a method of forming the same.

BACKGROUND

As the degree of integration of a semiconductor device increases, the horizontal widths and intervals of conductive interconnection patterns gradually become smaller. In order to form fine patterns, expensive photolithography facilities and complicated photolithography processes are used. For example, a double exposure process, a double patterning process, a double spacer process or the like is used. These double processes are very complex and have a high probability of failure because similar processes are performed twice.

SUMMARY

Exemplary embodiments provide a method of forming conductive interconnection patterns having finer widths and spaces than line widths and intervals of mask patterns formed in a photolithography process.

Exemplary embodiments provide a method of forming conductive interconnection patterns having finer widths and spaces than a line width and an interval of a pattern primarily formed by using a single spacer forming technique.

Various objects in specific implementations of the disclosed technology may be achieved and the applications of the disclosed technology are not limited to the specific implementations or examples disclosed in this patent document.

In accordance with an embodiment, a semiconductor device may include a lower interlayer dielectric layer; conductive interconnection pattern structure and filling pattern over the lower interlayer dielectric layer; and an upper interlayer dielectric layer over the conductive interconnection pattern structure and the filling pattern. Each of the conductive interconnection pattern structure may include an intermediate pattern in the center thereof; a first conductive interconnection pattern on a first side surface of the intermediate pattern; and a second conductive interconnection pattern on a second side surface of the intermediate pattern. The first conductive interconnection pattern and the second conductive interconnection pattern may have a symmetrical structure to each other.

In accordance with an embodiment, a method for fabricating a semiconductor device may include forming a stopper layer; forming an intermediate pattern material layer over the stopper layer; forming a plurality of first preliminary intermediate patterns by patterning the intermediate pattern material layer; forming a plurality of second preliminary intermediate patterns by shrinking the first preliminary intermediate patterns; forming a conductive material layer to cover the second preliminary intermediate patterns; forming a plurality of preliminary conductive interconnection patterns by patterning the conductive material layer; forming a filling layer between the preliminary conductive interconnection patterns; and forming a plurality of intermediate patterns, a plurality of conductive interconnection patterns and a plurality of filling patterns by removing top portions of the filling layer, the preliminary conductive interconnection patterns and the second preliminary intermediate patterns.

In accordance with an embodiment, a method for fabricating a semiconductor device may include forming a lower interlayer dielectric layer over a substrate; forming a stopper layer over the lower interlayer dielectric layer; forming first preliminary intermediate patterns over the stopper layer; forming second preliminary intermediate patterns by shrinking the first preliminary intermediate patterns; forming preliminary conductive interconnection patterns to cover top surfaces and both side surfaces of the second preliminary intermediate patterns; forming a filling layer between the preliminary conductive interconnection patterns; forming intermediate patterns with side surfaces, conductive interconnection patterns on side surfaces of the intermediate patterns and filling patterns between the conductive interconnection patterns by removing a top portion of each of the filling layer, the preliminary conductive interconnection patterns and the second preliminary intermediate patterns; forming a capping layer over the intermediate patterns, the conductive interconnection patterns and the filling patterns; and forming an upper interlayer dielectric layer over the capping layer.

The details of other embodiments are included in the detailed description and the drawings.

DETAILED DESCRIPTION

Figure 1:
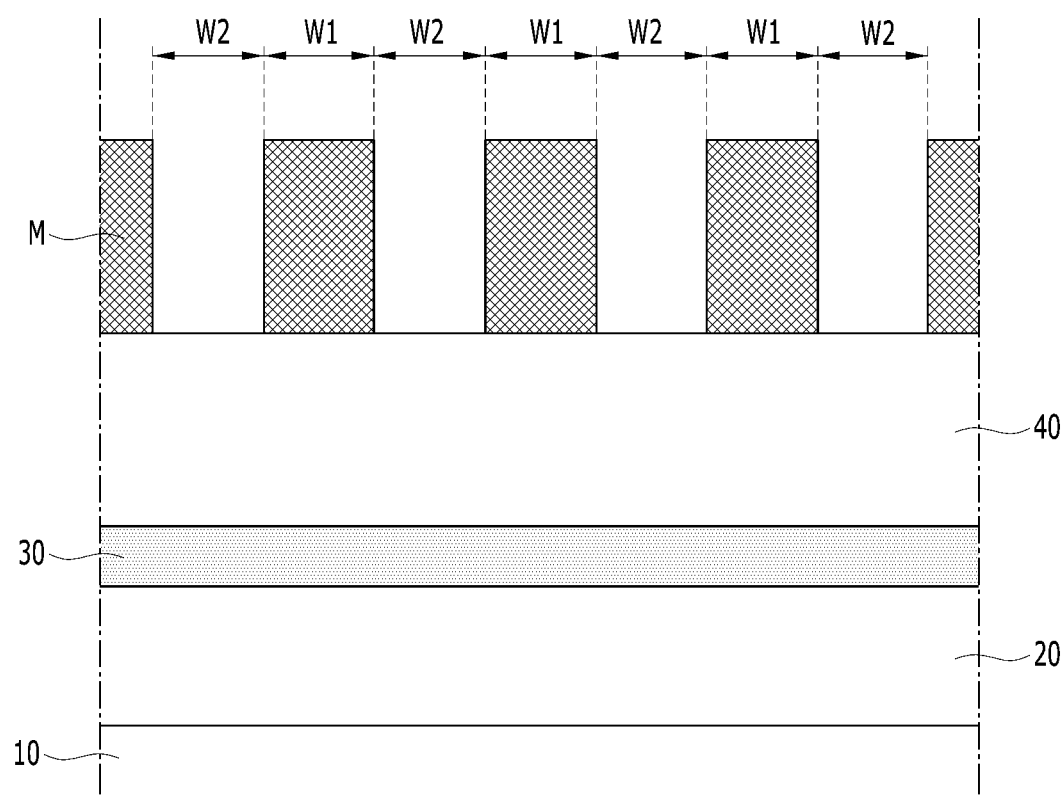
FIGS. 1 to 9 are cross-sectional views illustrating a method of forming conductive interconnection patterns of a semiconductor memory device in accordance with an embodiment of the disclosure.

Various embodiments will be described below in more detail with reference to the accompanying drawings. Embodiments of the present disclosure may, however, have different forms and should not be construed as limited to the embodiments set forth herein. Rather, these embodiments are provided so that this disclosure will be thorough and complete, and will fully convey the scope of the claims to those skilled in the art.

Throughout the specification, like reference numerals refer to the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

FIGS. 1 to 9 are cross-sectional views illustrating a method of forming conductive interconnection patterns of a semiconductor device in accordance with an embodiment.

Referring to FIG. 1, a method of forming the conductive interconnection patterns of a semiconductor device may include forming a lower interlayer dielectric layer 20 on a substrate 10 by performing a first deposition process; forming a stopper layer 30 on the lower interlayer dielectric layer 20 by performing a second deposition process; forming an intermediate pattern material layer 40 on the stopper layer 30 by performing a third deposition process; and forming mask patterns M on the intermediate pattern material layer 40 by performing a photolithography process.

The substrate 10 may include at least one of a monocrystalline silicon wafer, an epitaxially grown mono-crystalline silicon layer, or a Silicon-On-Insulator (SOI) layer. In some embodiments, the substrate 10 may be a dielectric material covering various electrical circuits.

The lower interlayer dielectric layer 20 may include a dielectric material covering various electrical circuits (not illustrated) formed on the substrate 10. For example, the lower interlayer dielectric layer 20 may include at least one of silicon oxide ($SiO_2$); silicon nitride (SiN); silicon oxynitride (SiON); silicon hydride oxide (SiOH); or silicon carbide oxide (SiCO), or any combination thereof. The first deposition process may include a chemical vapor deposition (CVD) process.

The stopper layer 30 may include a dielectric material, denser and harder than both the lower interlayer dielectric layer 20 and the intermediate pattern material layer 40. The stopper layer 30 may include a material different from, or not included in, the lower interlayer dielectric layer 20, so that stopper layer 30 has a different etch selectivity from both the lower interlayer dielectric layer 20 and the intermediate pattern material layer 40. For example, the stopper layer 30 may include at least one of silicon nitride (SiN); silicon oxynitride (SiON); hydrogen (H)-containing material such as silicon hydride oxide (SiOH); carbon (C)-containing material such as silicon carbide oxide (SiCO); silicon carbide nitride (SiCN); or silicon carbide oxynitride (SiCON), or any combination thereof. Thus, the second deposition process may include a CVD process to form a silicon nitride layer.

The intermediate pattern material layer 40 may include at least one of silicon oxide ($SiO_2$), silicon nitride (SiN), silicon oxynitride (SiON), hydrogen (H)-containing material such as silicon hydride oxide (SiOH), carbon (C)-containing material such as silicon carbide oxide (SiCO), silicon carbide nitride (SiCN), or silicon carbide oxynitride (SiCON), or any combination thereof. For example, the third deposition process may include a CVD process to form a silicon oxide layer.

The mask patterns M may include organic patterns containing an organic polymeric material such as photoresist, and/or other inorganic patterns such as silicon oxide ($SiO_2$), silicon nitride (SiN), silicon oxynitride (SiON), silicon carbide nitride (SiCN), or silicon carbide oxynitride (SiCON).

Horizontal widths W1 of the mask patterns M may be substantially equal or similar to horizontal intervals W2 between the mask patterns M. The horizontal widths W1 of the mask patterns M and the horizontal intervals W2 between the mask patterns M may be dimensions that are at or close to the minimum resolution of photolithography processes. The minimum resolution may represent or refer to the minimum widths and/or minimum intervals within patterns that may be formed in any given photolithography apparatus.

Figure 2:
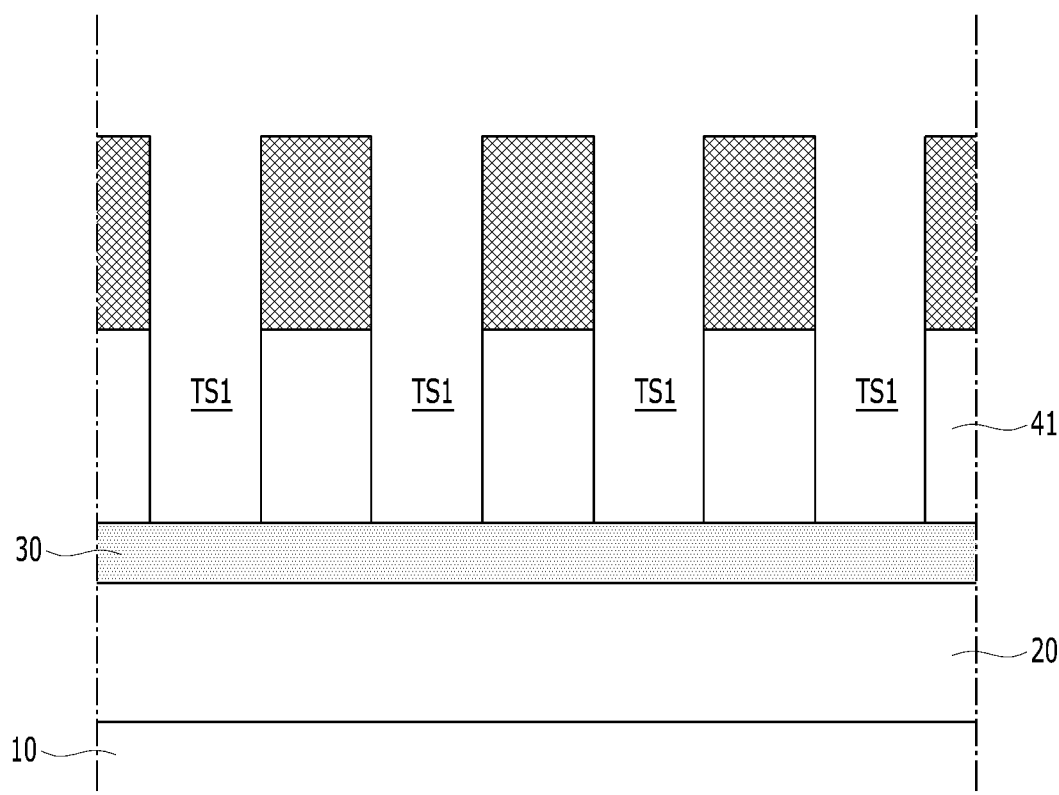

Referring to FIG. 2, the method may include patterning the intermediate pattern material layer 40 by performing a first etch process using the mask patterns M as etch masks. The intermediate pattern material layer 40 may be patterned into first preliminary intermediate patterns 41. Each of the first preliminary intermediate patterns 41 may have a line or bar-like shape extending horizontally. First trench spaces TS1 may be present between the first preliminary intermediate patterns 41. The stopper layer 30 may be exposed between the first preliminary intermediate patterns 41. In the first etch process, vertical heights and horizontal widths, illustrated in FIG. 2, of the mask patterns M may be reduced.

Figure 3:
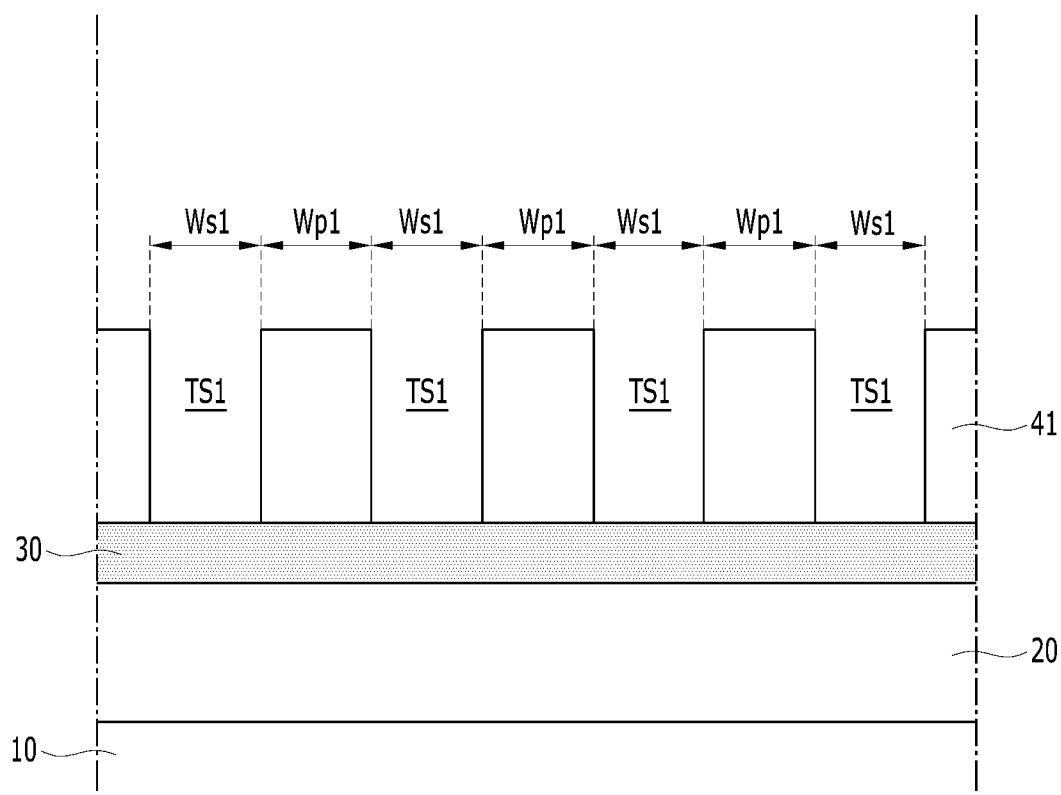

Referring to FIG. 3, the method may include removing the mask patterns M by performing an ashing process or a stripping process, for example. The ashing process may include an oxygen ($O_2$) plasma process. The stripping process may include a sulfuric acid boiling process and a wet removing process using hydrofluoric acid or phosphoric acid. First horizontal widths Wp1 of the first preliminary intermediate patterns 41 may be substantially equal or similar to first horizontal widths Ws1 of the first trench spaces TS1, namely, Wp1=Ws1. Referring back to FIG. 1, the first horizontal widths Wp1 of the first preliminary intermediate patterns 41 may be substantially equal or similar to or smaller than the horizontal widths W1 of the mask patterns M. The first horizontal widths Ws1 of the first trench spaces TS1 may be substantially equal or similar to or greater than the horizontal intervals W2 between the mask patterns M.

Figure 4:
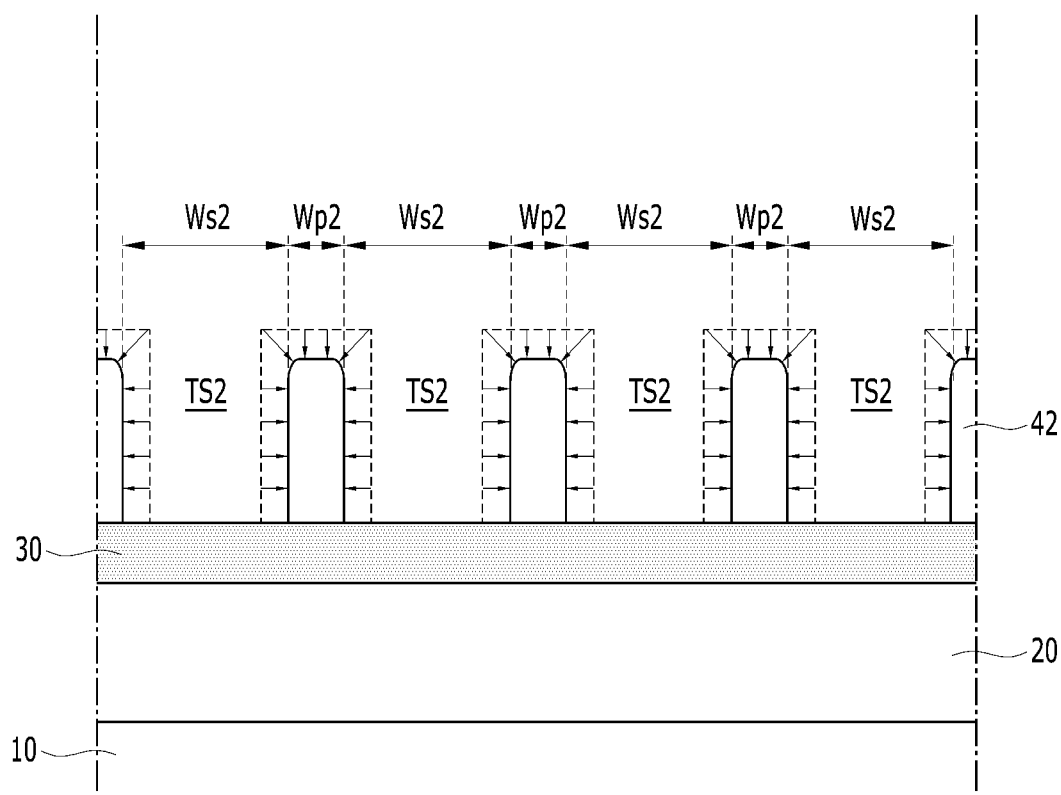

Referring to FIG. 4, the method may include forming second preliminary intermediate patterns 42 by shrinking the first preliminary intermediate patterns 41 by performing a shrinking process. The shrinking process may include a soft etch process using a diluted etchant or a strong cleaning process using concentrated cleaning fluid. For example, the forming of the second preliminary intermediate patterns 42 may include partially removing the upper and all side portions or parts of the first preliminary intermediate patterns 41 by performing an isotropic etch process or the like. The first preliminary intermediate patterns 41 are reduced in size to the second preliminary intermediate patterns 42. The first trench spaces TS1 may be transformed into widened second trench spaces TS2 as material is removed from side areas or regions of first preliminary intermediate patterns 41. That is, the shrinking process may include widening the first trench spaces TS1 to form the second trench spaces TS2. Horizontal widths Ws2 of the second trench spaces TS2 may be approximately three times greater than horizontal widths Wp2 of the second preliminary intermediate patterns 42. The ratio of the dimensions of horizontal widths Wp2 to horizontal widths Ws2 may be 3:1. Vertical heights, i.e., thicknesses may shrink in a half proportion of the first preliminary intermediate patterns 41.

Figure 5:
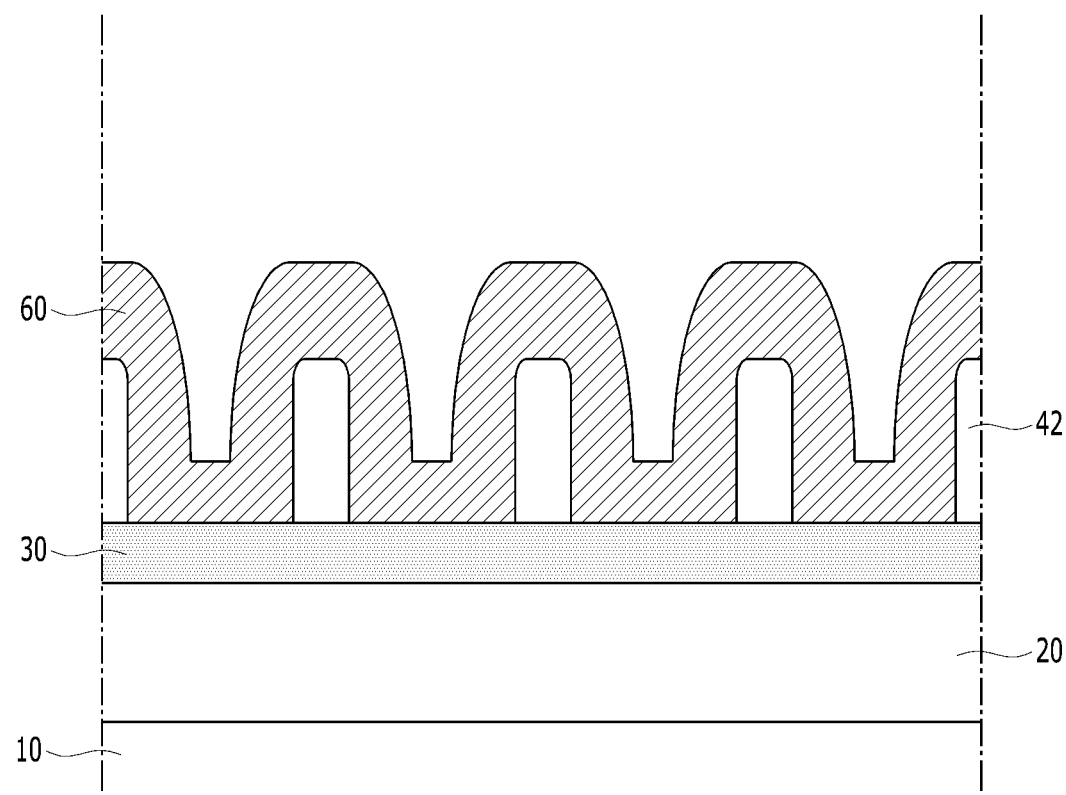

Referring to FIG. 5, the method may further include entirely forming a conductive material layer 60 to cover the exposed surfaces of second preliminary intermediate patterns 42 by performing a deposition process. This may be the fourth deposition process in the method. For example, the conductive material layer 60 may include a conductor such as a metal. The conductive material layer 60 may completely cover the second preliminary intermediate patterns 42. The conductive material layer 60 may be formed on, for example in a semi-conformal manner, along the profiles of the second preliminary intermediate patterns 42. The deposition process may include a sputtering process, a Physical Vapor Deposition (PVD) process or a CVD process to form a metal layer.

Figure 6:
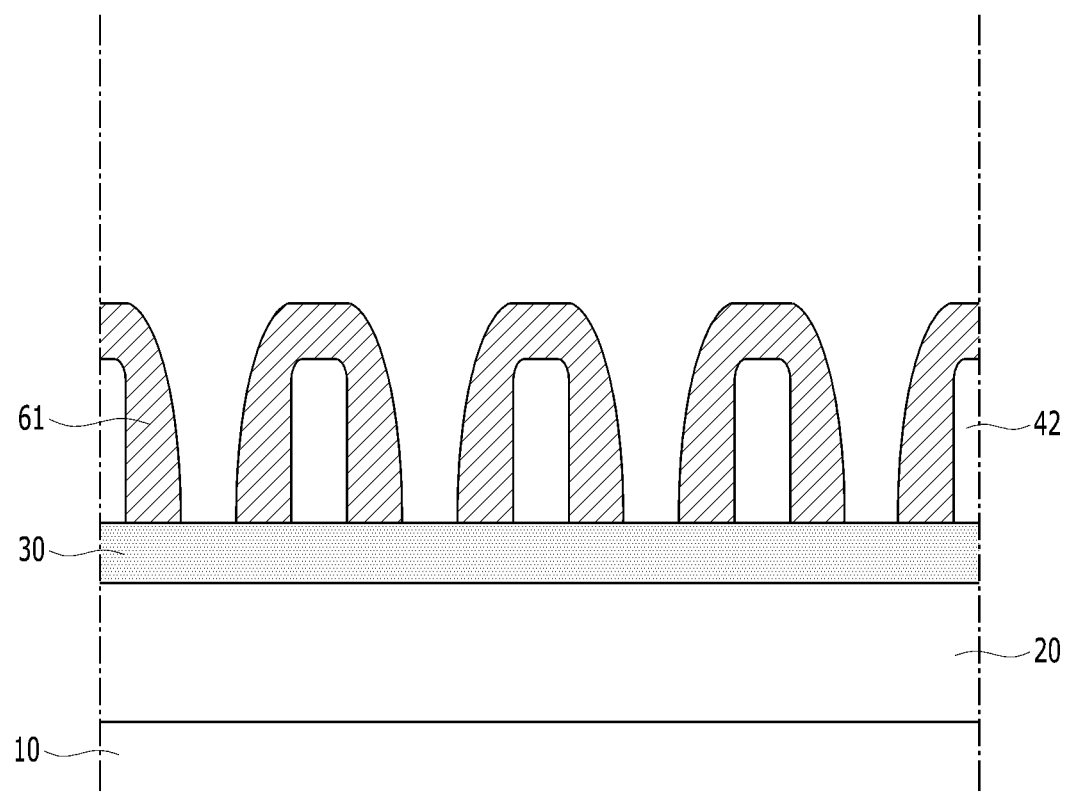

Referring to FIG. 6, the method may further include forming first preliminary conductive interconnection patterns 61 by blanket-etching the conductive material layer 60 in a second etch process. The second etch process may include an anisotropic etch-back process. For example, the second etch process may include a physical sputtering etch process. As the conductive material layer 60 shrinks or is reduced in both vertical and horizontal directions, the first preliminary conductive interconnection patterns 61 may be formed in a mound or sheath-like shapes covering or surrounding the second preliminary intermediate patterns 42 using the etch-back process to form a spacer shape. In other words, the first preliminary conductive interconnection patterns 61 may completely cover the top and side surfaces of the second preliminary intermediate patterns 42. The surface of the stopper layer 30 may be exposed between the first preliminary conductive interconnection patterns 61. The first preliminary conductive interconnection patterns 61 may be converted into or configured for use as individual patterns that are physically and electrically separated from one another.

Figure 7:
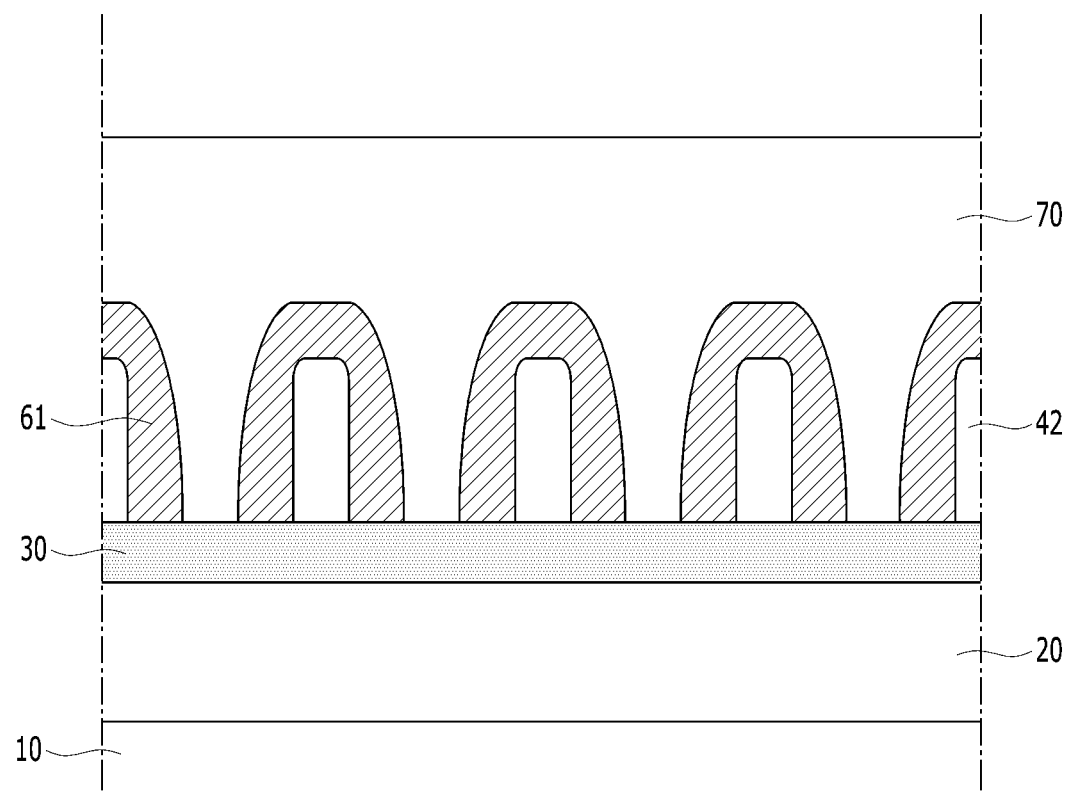

Referring to FIG. 7, the method may further include wholly or entirely forming a filling layer 70 covering the first preliminary conductive interconnection patterns 61 by performing a deposition process. This may be a fifth deposition process. The filling layer 70 may fill spaces between the first preliminary conductive interconnection patterns 61. The filling layer 70 may include at least one of silicon oxide ($SiO_2$); silicon nitride (SiN); or silicon oxynitride (SiON), or any combination thereof. The deposition process may include a CVD process to form a silicon oxide layer.

Figure 8:
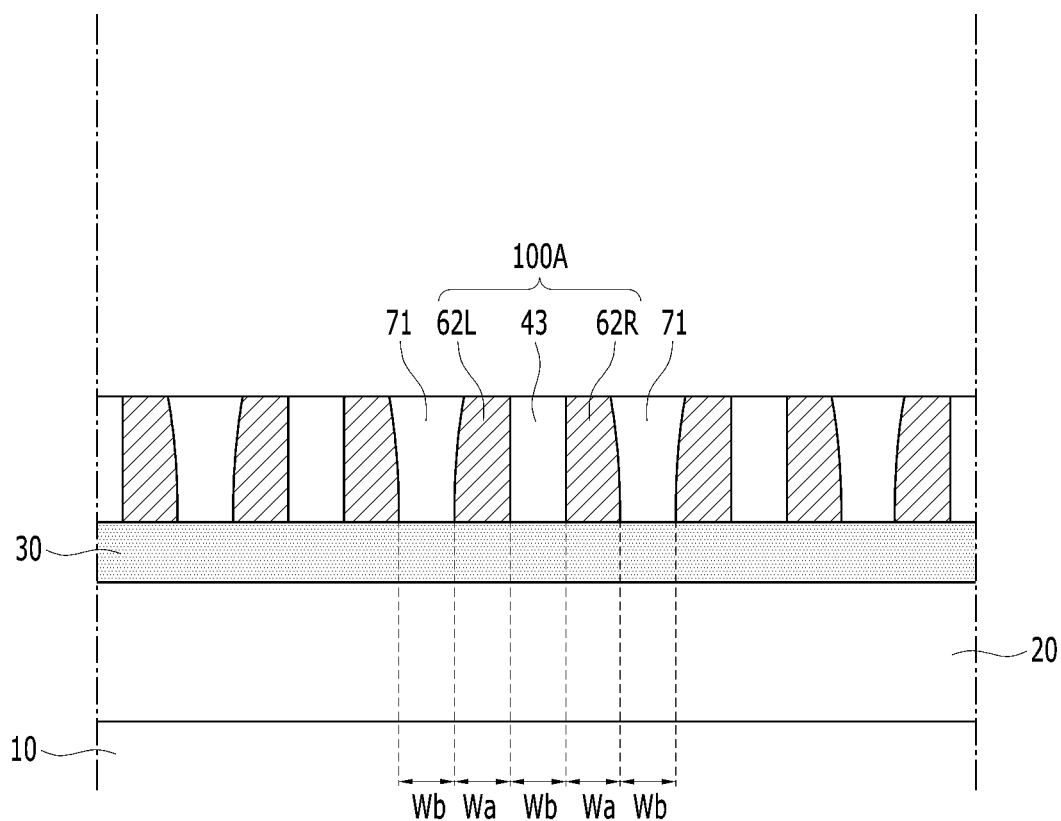

Referring to FIG. 8, the method may further include forming conductive pattern structures 100A and filling patterns 71 by partially removing upper portions or regions of the filling layer 70; the first preliminary conductive interconnection patterns 61; and the second preliminary intermediate patterns 42 by performing a Chemical Mechanical Polishing (CMP) process. Each resulting conductive pattern structure 100A may include intermediate patterns 43 between or sandwiched by conductive interconnection patterns 62L and 62R. For example, the conductive pattern structure 100A includes an intermediate pattern 43 positioned in the center, left conductive interconnection patterns 62L positioned on the left side of the intermediate pattern 43, and right conductive interconnection pattern 62R positioned on the right side of the intermediate pattern 43. Two or more conductive pattern structures 100A may be formed spaced apart on stopper layer 30. The filling patterns 71 may be formed between the conductive pattern structures 100A and on stopper layer 30. For example, the left conductive interconnection patterns 62L may be formed on left side surfaces of the intermediate patterns 43, and right conductive interconnection patterns 62R may be formed on the right side surfaces of the intermediate patterns 43. Each of the left conductive interconnection patterns 62L may have a right side surface, closer to in contact with the intermediate pattern 43, that is substantially vertical and flat, and a left side surface that is non-planar and tapered in a vertical direction, from a wider base (wider lower portion) closer to or in contact with the surface of the stopper layer 30 to a narrower upper portion. For example, a cross-section of the left side surface of the conductive interconnection pattern 62L may be rounded and inclined, for example by following a circular or elliptical arc, so that the upper portion is narrower, and the lower portion is wider. Each of the right conductive interconnection patterns 62R may have a left side surface, closer to or in contact with the intermediate pattern 43, that is substantially vertical and flat, and a right side surface that is non-planar and tapered in a vertical direction, from a wider base (wider lower portion) closer to or in contact with the surface of the stopper layer 30 to a narrower upper portion. For example, a cross-section of the right side surface of the conductive interconnection pattern 62R may be rounded and inclined so that the upper portion is narrower, and the lower portion is wider, for example along a circular or elliptical arc. The left conductive interconnection patterns 62L and the right conductive interconnection patterns 62R may form a bilaterally symmetrical structure with an intermediate pattern 43 at the center of the structure. For example, the left conductive interconnection patterns 62L and the right conductive interconnection patterns 62R may be alternately disposed on either side of, to face or opposite to each other, an intermediate pattern 43. The left conductive interconnection patterns 62L and the right conductive interconnection patterns 62R may have substantially flat or planar bottom, or lower, surfaces and top, or upper, surfaces. The horizontal widths of the top surfaces of the left conductive interconnection patterns 62L and the right conductive interconnection patterns 62R may be smaller than Wa, the horizontal widths of the bottom surfaces, closer to or in contact with the stopper layer 30, of the left conductive interconnection patterns 62L and the right conductive interconnection patterns 62R. The filling pattern 71 may be disposed between the conductive pattern structures 100A. For example, the filling pattern 71 can be formed on the stopper layer 30 in spaces or gaps between the left conductive patterns 62L of one conductive pattern structure 100A and the right conductive pattern 62R of an adjacent conductive pattern structure 100A. The filling pattern 71 may also be disposed between the right conductive pattern 62R of one conductive pattern structure 100A and the left conductive pattern 62L of another adjacent conductive pattern structure 100A.

Each of the intermediate patterns 43 may have both side surfaces that are substantially vertical and flat closer to or in contact with the left conductive interconnection patterns 62L and the right conductive interconnection patterns 62R. Each of the filling patterns 71 may have side surfaces that are non-planar and tapered in a vertical direction, from a narrower base (narrower lower portion) closer to or in contact with the stopper layer 30 to a wider upper surface. For example, both side surfaces of the filling pattern 71 may be negatively rounded so that the upper portion is wider and the lower portion is narrower. The rounded sides may have a cross-section shape that follows a circular or an elliptical arc.

The CMP process may include a first CMP process, a second CMP process, and a third CMP process. The first CMP process may mainly remove the filling layer 70. The second CMP process may remove the filling layer 70 and the preliminary conductive interconnection patterns 61. The third CMP process may remove the filling layer 70, the preliminary conductive interconnection patterns 61, and the second preliminary intermediate patterns 42. The intermediate patterns 43, the conductive interconnection patterns 62L and 62R, and the filling patterns 71 may be substantially coplanar with one another. In the second and third CMP processes, the intermediate patterns 43 may be used as a CMP stopper layer.

In embodiments disclosed herein, the left conductive interconnection patterns 62L and the right conductive interconnection patterns 62R may have horizontal widths Wa and/or horizontal intervals Wb closer to or in contact with the stopper layer 30 that are smaller than the minimum horizontal widths W1 and/or the minimum horizontal intervals W2 of the limit (marginal) resolution of the photolithography process. As an example, a horizontal interval Wb between a left conductive interconnection pattern 62L and a right conductive interconnection pattern 62R may be equal or similar to the horizontal width of an intermediate pattern 43 and/or a filling pattern 71, each of which are less than W1 and/or W2.

In embodiments disclosed herein, the sum of the horizontal width Wa of the left or right conductive interconnection pattern 62L or 62R and the horizontal interval Wb between the left conductive interconnection pattern 62L and the right conductive interconnection pattern 62R may be equal or substantially equal to the minimum horizontal width W1 and/or the minimum horizontal interval W2 of the limit resolution. For example, Wa+Wb=W1=W2=Wp1=Ws1.

Figure 9:
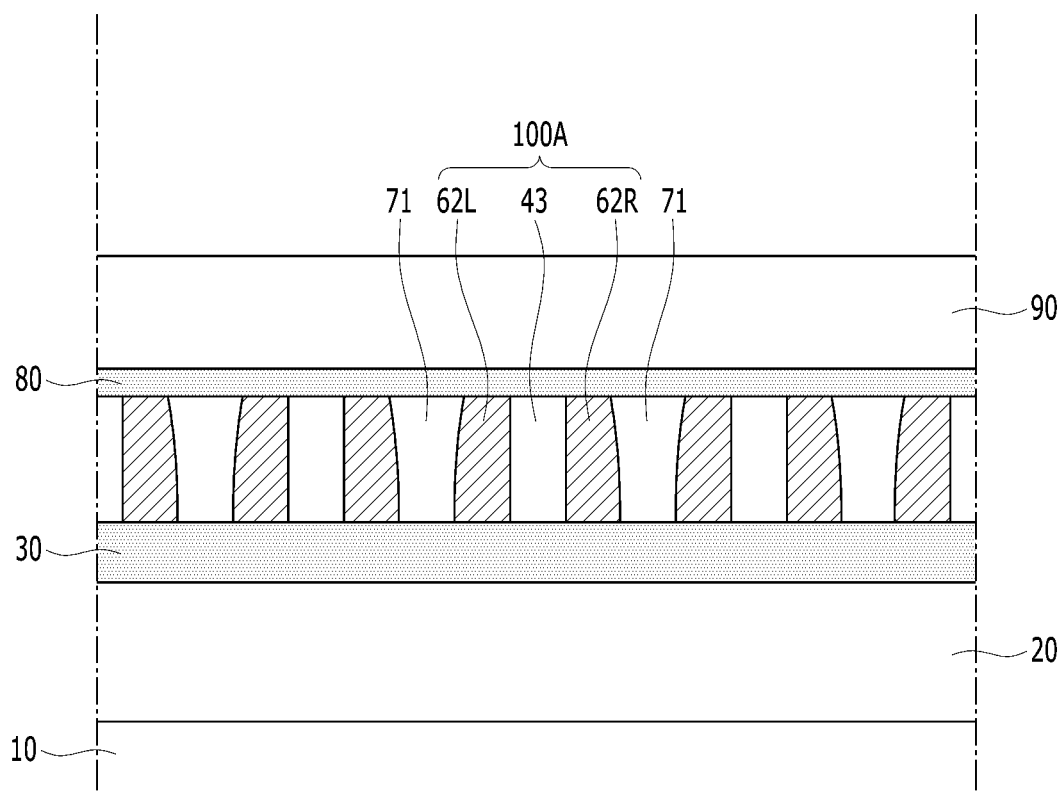

Referring to FIG. 9, the method may include forming a capping layer 80 on the conductive pattern structures 100A and the filling patterns 71 by performing a deposition process. This may be the sixth deposition process. The method may further include forming an upper interlayer dielectric layer 90 on the capping layer 80 by performing another deposition process, which can be a seventh deposition process. The capping layer 80 may include a material denser and harder than the material used to form intermediate patterns 43 and the filling patterns 71. For example, the capping layer 80 may include at least one of silicon nitride (SiN), silicon oxynitride (SiON) or a combination thereof. Accordingly, the sixth deposition process may include a CVD process for depositing silicon nitride (SiN). The upper interlayer dielectric layer 90 may include at least one of silicon oxide ($SiO_2$); silicon nitride (SiN); silicon oxynitride (SiON); silicon hydride oxide (SiOH); or silicon carbide oxide (SiCO), or any combination thereof. For example, the seventh deposition process may include a CVD process to form silicon oxide ($SiO_2$).

In disclosed embodiments, patterns having finer resolution than the limit (marginal) resolution may be formed using a mask patterns only in a photolithography process.

FIGS. 10 to 15 are cross-sectional views illustrating a method of forming conductive interconnection patterns of a semiconductor device in accordance with an embodiment.

Figure 10:
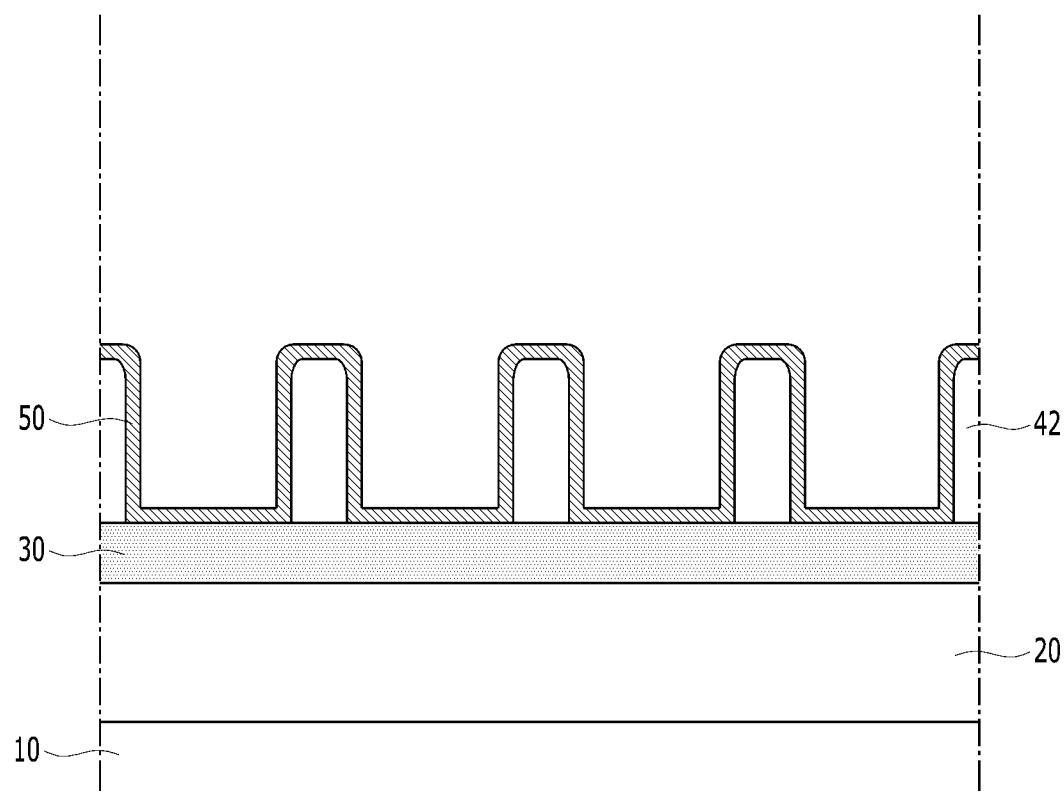
FIGS. 10 to 15 are cross-sectional views illustrating a method of forming conductive interconnection patterns of a semiconductor memory device in accordance with an embodiment of the disclosure.

Referring to FIG. 10, a method of forming the conductive interconnection patterns of a semiconductor device may include sequentially forming a lower interlayer dielectric layer 20, a stopper layer 30, an intermediate pattern material layer 40 and mask patterns M over a substrate 10, forming first preliminary intermediate patterns 41 by patterning the intermediate pattern material layer 40, removing the mask patterns M, and forming second preliminary intermediate patterns 42 by shrinking the first preliminary intermediate patterns 41, by performing the series of processes described above and with reference to FIGS. 1 to 4, and forming a barrier material layer 50 to cover or surround exposed areas of the second preliminary intermediate patterns 42 and the exposed portions of stopper layer 30.

The barrier material layer 50 may be conformally formed on the top and side surfaces of the second preliminary intermediate patterns 42 and the exposed surfaces of the stopper layer 30. The barrier material layer 50 may include at least one of conductive barrier materials such as titanium nitride (TiN); tantalum nitride (TaN); or tungsten nitride (WN), or dielectric barrier materials such as silicon nitride (SiN) or silicon oxynitride (SiON). The barrier material layer 50 may be formed by performing a PVD process or a CVD process.

Figure 11:
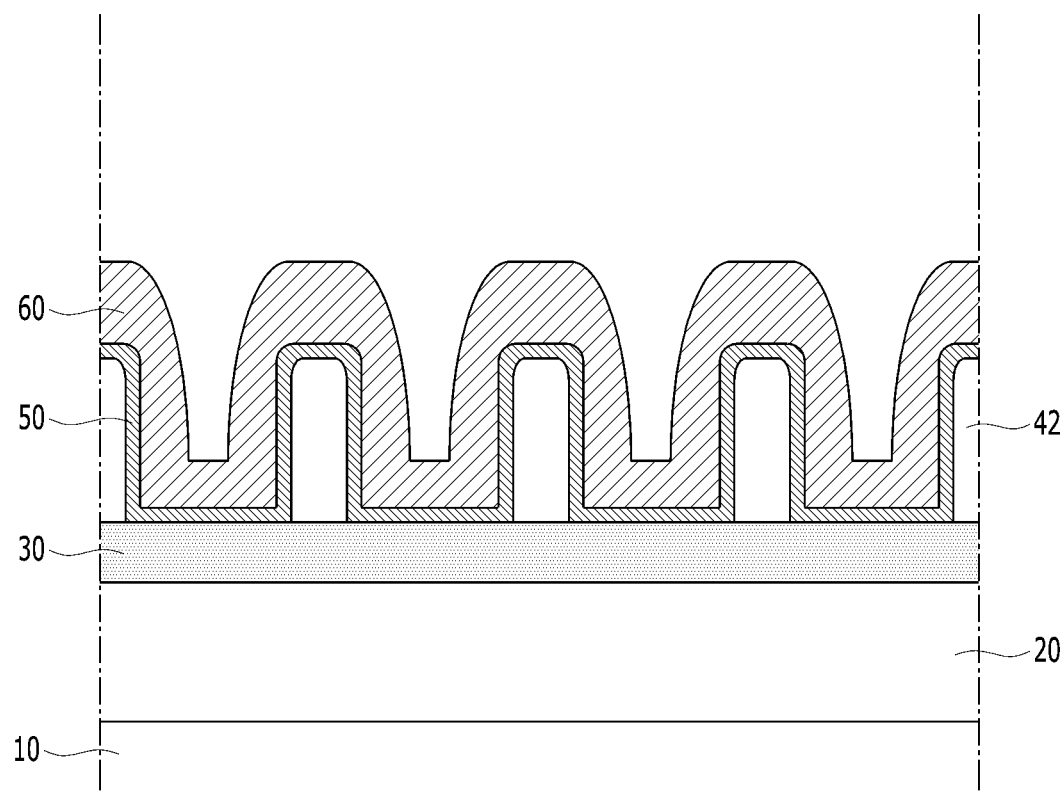

Referring to FIG. 11, the method may further include forming a conductive material layer 60 wholly or entirely covering the exposed surface of barrier material layer 50 by performing the process described above and with reference to FIG. 5. The barrier material layer 50 may enhance the adhesion between the second preliminary intermediate patterns 42 and the conductive material layer 60.

Figure 12:
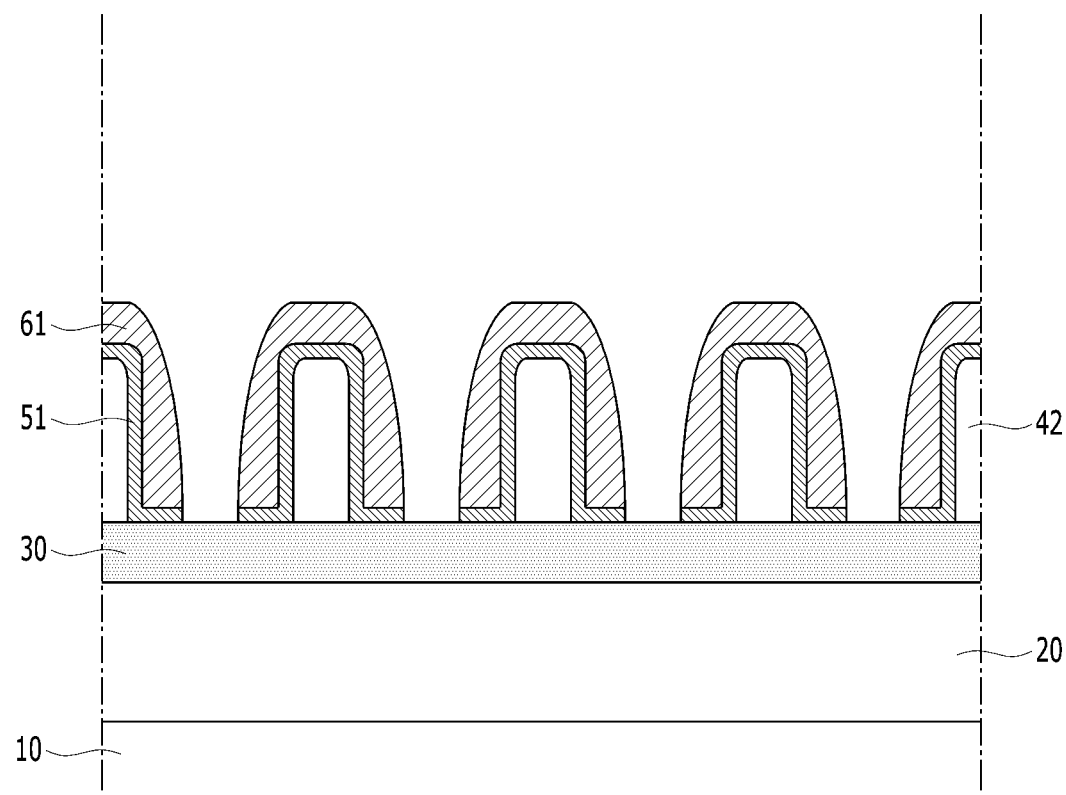

Referring to FIG. 12, the method may further include forming preliminary conductive interconnection patterns 61 by blanket-etching the conductive material layer 60 by performing the process described above and with reference to FIG. 6, and forming preliminary barrier patterns 51 by sequentially etching the barrier material layer 50 to create gaps or spaces in the conductive material layer 60 and the barrier material layer 50 closer to or in contact with the stopper layer 30. As a result, portions of the upper surface of the stopper layer 30 may be exposed between the preliminary conductive interconnection patterns 61 and the preliminary barrier patterns 51.

Figure 13:
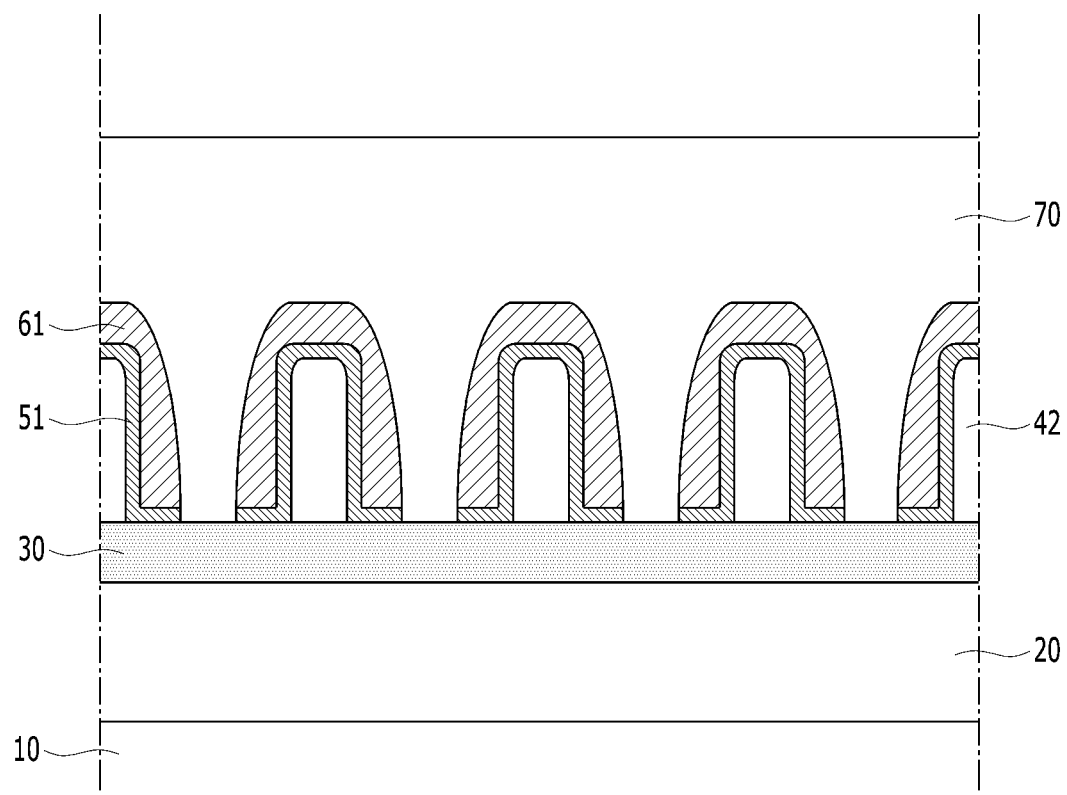

Referring to FIG. 13, the method may further include forming a filling layer 70 across the resultant structure by performing the process described above and with reference to FIG. 7.

Figure 14:
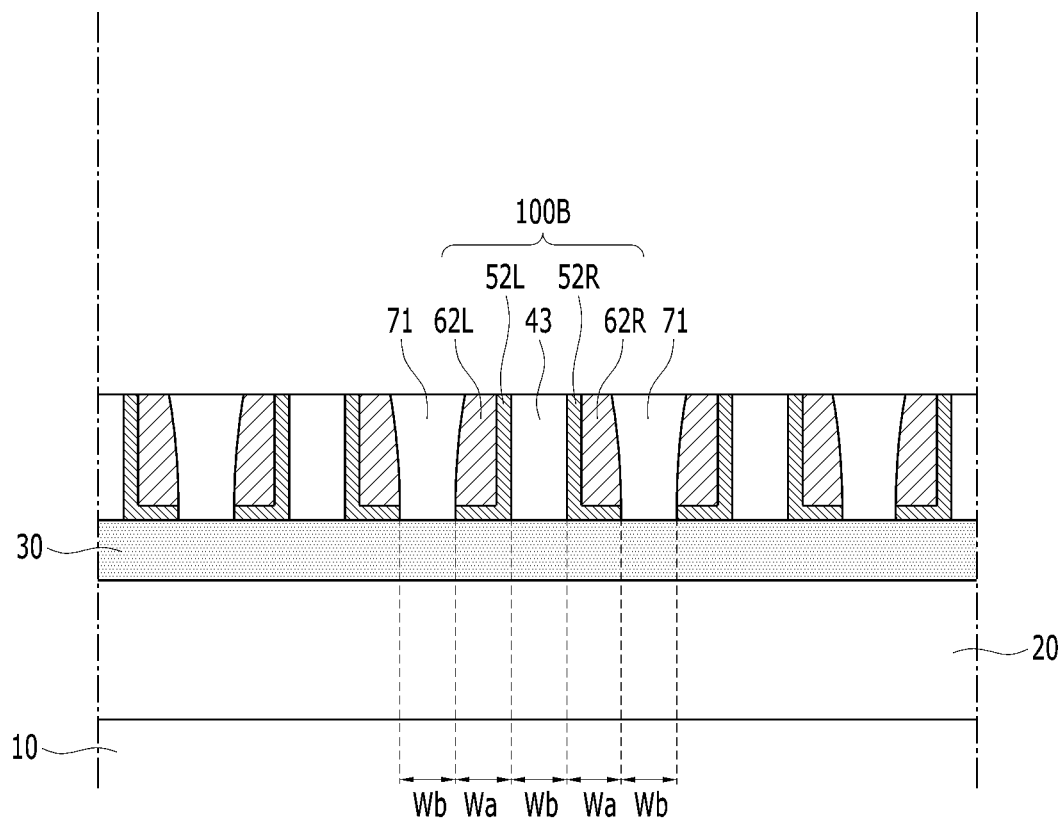

Referring to FIG. 14, the method may further include forming a conductive pattern structure 100B and filling patterns 71 by partially removing upper regions of the filling layer 70, the preliminary conductive interconnection patterns 61, the preliminary barrier patterns 51, and the second preliminary intermediate patterns 42 by performing CMP processes. The conductive pattern structure 100B may include an intermediate pattern 43, a left barrier pattern 52L, a right barrier pattern 52R, a left conductive interconnection pattern 62L, and a right conductive interconnection pattern 62R. The filling patterns 71 may be disposed between the conductive pattern structures 100B.

Each of the intermediate patterns 43 may have both side surfaces that are substantially vertical and flat closer to or in contact with the left conductive interconnection patterns 62L and the right conductive interconnection patterns 62R. Each of the filling patterns 71 may have both side surfaces that are non-planar and tapered in a vertical direction, from a narrower base closer to or in contact with the stopper layer 30 to a wider upper surface. For example, both side surfaces of the filling pattern 71 may be rounded negatively so that the upper portion is wider, and the lower portion is narrower. The rounded sides may have a cross-section shape that that follows a circular or an elliptical arc.

Each of the left barrier patterns 52L may include a vertical portion between the left side surface of an intermediate pattern 43 and the right side surface of a left conductive interconnection pattern 62L, and a horizontal portion between the bottom, or lower, surface of the left conductive interconnection pattern 62L and the top surface of the stopper layer 30. Each of the right barrier patterns 52R may include a vertical portion between the right side surface of an intermediate pattern 43 and the left side surface of a right conductive interconnection pattern 62R, and a horizontal portion between the bottom surface of the right conductive interconnection pattern 62R and the top surface of the stopper layer 30. In other words, each of the left barrier patterns 52L may have an inverted-L shaped cross-section, and each of the right barrier patterns 52R may have an L-shaped cross-section. Accordingly, the left barrier patterns 52L and the right barrier patterns 52R may form a bilaterally symmetrical structure centered on an intermediate pattern 43.

Each of the left conductive interconnection patterns 62L may have a right side surface, closer to or in contact with a left barrier pattern 52L, that is substantially vertical and flat and a left side surface that is non-planar and tapered in a vertical direction, from a wider base closer to or in contact with the stopper layer 30 to a narrower upper portion. For example, a cross-section of the left side surface of a conductive interconnection pattern 62L may be rounded and inclined, for example by following a circular or elliptical arc, so that the upper portion is narrower and the lower portion is wider. Each of the right conductive interconnection patterns 62R may have a left side surface, close to or in contact with a right barrier pattern 52R, that is substantially vertical and flat and a right side surface that is non-planar and tapered in a vertical direction, from a wider base closer to or in contact with the stopper layer 30 to a narrower upper portion. For example, a cross-section of the right side surface of a conductive interconnection pattern 62R may be rounded and inclined so that the upper portion is narrower and the lower portion is wider, for example along a circular or elliptical arc. The left conductive interconnection patterns 62L and the right conductive interconnection patterns 62R may form a bilaterally symmetrical structure with an intermediate pattern 43 at the center of the structure.

Each of the filling patterns 71 may have tapered side surfaces with negative slopes. For example, both side surfaces of the filling pattern 71 may be rounded negatively so that the upper portion is wider and the lower portion is narrower. The rounded sides may have a cross-section shape that that follows a circular or an elliptical arc.

The intermediate patterns 43, the left and right barrier patterns 52L and 52R, the left and right conductive interconnection patterns 62L and 62R and the filling patterns 71 may be substantially coplanar with one another as a result of a CMP process. The intermediate patterns 43 may be used as a CMP stopper layer.

Figure 15:
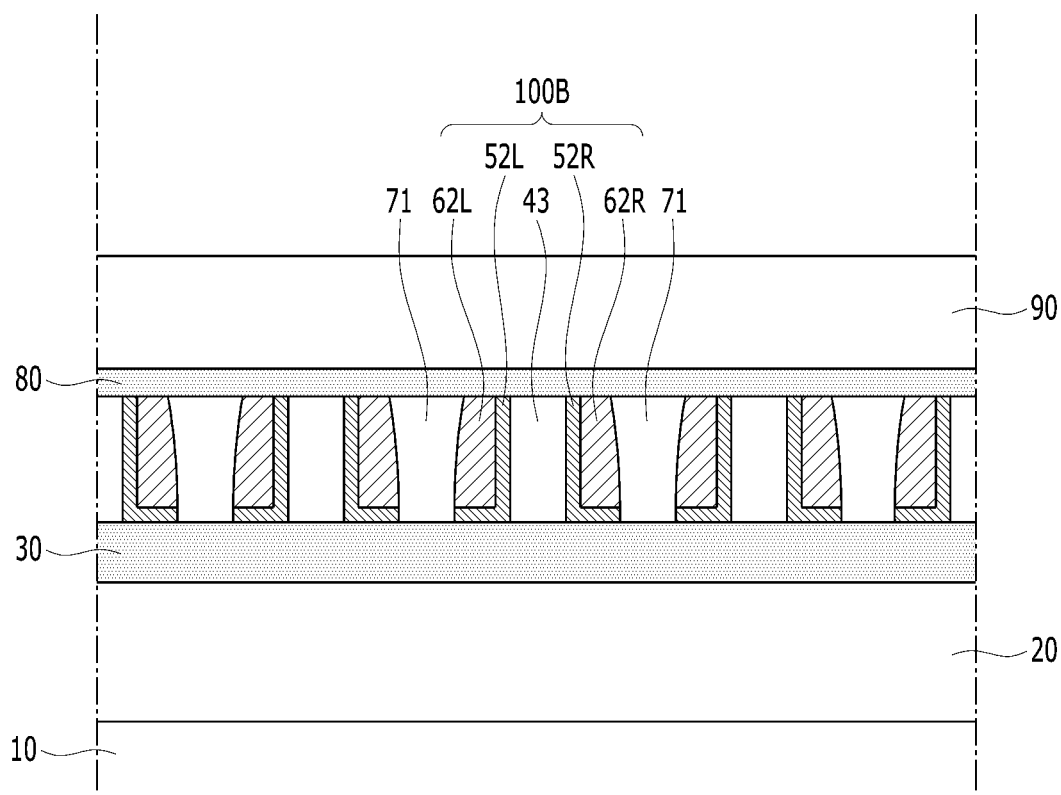

Referring to FIG. 15, the method may further include forming a capping layer 80 on the conductive pattern structures 100B and forming a top interlayer dielectric layer 90 on the capping layer 80, by performing the series of processes described above and with reference to FIG. 9.

In accordance with the disclosed embodiments, it is possible to form the conductive interconnection patterns having smaller widths and intervals than the widths and intervals of the mask patterns in a photolithography process.

In accordance with disclosed embodiments, it is possible to form the conductive interconnection patterns having smaller widths and intervals than the widths and intervals of the mask patterns formed in the photolithography process by performing one photolithography process and one etch-back process to form a mound or sheath-like shapes.

While the present invention has been described with respect to specific embodiments, it is noted that the present invention may be achieved in various ways by performing substitution, change, and modification, by those skilled in the art without departing from the spirit and/or scope of the present invention as defined by the following claims. Therefore, it should be noted that the embodiments are not intended to be restrictive, but rather descriptive.

What is claimed is:

1. A method for fabricating a semiconductor device, comprising:
   forming a stopper layer;
   forming an intermediate pattern material layer over the stopper layer;
   forming a plurality of first preliminary intermediate patterns by patterning the intermediate pattern material layer;
   forming a plurality of second preliminary intermediate patterns by shrinking the first preliminary intermediate patterns;
   forming a conductive material layer to cover the second preliminary intermediate patterns;
   forming a plurality of preliminary conductive interconnection patterns by patterning the conductive material layer;
   forming a filling layer between the preliminary conductive interconnection patterns; and
   forming a plurality of intermediate patterns, a plurality of conductive interconnection patterns and a plurality of filling patterns by removing top portions of the filling layer, the preliminary conductive interconnection patterns and the second preliminary intermediate patterns.

2. The method of claim 1, wherein vertical heights and horizontal widths of the first preliminary intermediate patterns are greater than vertical heights and horizontal widths of the second preliminary intermediate patterns.

3. The method of claim 1, wherein the conductive interconnection patterns include left conductive interconnection patterns formed on the left of the intermediate patterns and right conductive interconnection patterns formed on the right of the intermediate patterns,
   wherein each of the left conductive interconnection patterns includes a flat right side surface and a rounded left side surface, and
   each of the right conductive interconnection patterns includes a flat left side surface and a rounded right side surface.

4. The method of claim 3, wherein each of the intermediate patterns includes both flat side surfaces, and
   each of the filling patterns includes both side surfaces that are rounded to have negative slopes where a bottom portion is narrow and a top portion is wide.

5. The method of claim 3, wherein the sum of a horizontal width of each left conductive interconnection pattern and a horizontal width of each intermediate pattern is equal to a horizontal width of each first preliminary intermediate pattern.

6. The method of claim 3, wherein the sum of a horizontal width of each right conductive interconnection pattern and a horizontal width of each intermediate pattern is equal to a horizontal width of each first preliminary intermediate pattern.

7. The method of claim 3, wherein the sum of a horizontal width of each left conductive interconnection pattern and a horizontal width of each right conductive interconnection pattern is equal to a horizontal width of each first preliminary intermediate pattern.

8. The method of claim 1, wherein the intermediate pattern material layer and the filling layer include at least one of silicon oxide, silicon nitride, or silicon oxynitride, or any combination thereof.

9. The method of claim 1, wherein the conductive material layer includes a metal.

10. The method of claim 1, wherein the forming of the preliminary conductive interconnection patterns by patterning the conductive material layer includes performing an etch-back process, and the plurality of preliminary conductive interconnection patterns are formed by separating the conductive material layer.

11. The method of claim 1, wherein the removing of a top portion of the filling layer, the preliminary conductive interconnection patterns and the second preliminary intermediate patterns includes performing a Chemical Mechanical Polishing (CMP) process, and wherein a top surface of each of the intermediate patterns, the conductive interconnection patterns and the filling patterns are coplanar with one another.

12. The method of claim 1, further comprising:

forming a barrier material layer between the second preliminary intermediate patterns and the conductive material layer; and forming a plurality of barrier patterns which are physically separate, by patterning the barrier material layer after the forming of the preliminary conductive interconnection patterns.

13. A method for fabricating a semiconductor device, comprising:

forming a lower interlayer dielectric layer over a substrate;

forming a stopper layer over the lower interlayer dielectric layer;

forming first preliminary intermediate patterns over the stopper layer;

forming second preliminary intermediate patterns by shrinking the first preliminary intermediate patterns;

forming preliminary conductive interconnection patterns to cover top surfaces and both side surfaces of the second preliminary intermediate patterns;

forming a filling layer between the preliminary conductive interconnection patterns;

forming intermediate patterns with side surfaces, conductive interconnection patterns on the side surfaces of the intermediate patterns and filling patterns between the conductive interconnection patterns by removing a top portion of each of the filling layer, the preliminary conductive interconnection patterns and the second preliminary intermediate patterns;

forming a capping layer over the intermediate patterns, the conductive interconnection patterns and the filling patterns; and forming an upper interlayer dielectric layer over the capping layer.

14. The method of claim 13, wherein the forming of the second preliminary intermediate patterns includes partially removing portions from the top and both sides of the first preliminary intermediate patterns by performing an isotropic etch process on the first preliminary intermediate patterns.

15. The method of claim 13, wherein the forming of the preliminary conductive interconnection patterns includes:

forming a conductive material layer over the stopper layer to cover top surfaces and side surfaces of the second preliminary intermediate patterns; and separating the conductive material layer into the preliminary conductive interconnection patterns by performing an etch-back process.

16. The method of claim 13, wherein top surfaces of the intermediate patterns, the conductive interconnection patterns, and the filling patterns are coplanar with one another.

17. The method of claim 13, wherein the conductive interconnection patterns include left conductive interconnection patterns formed on the left of the intermediate patterns and right conductive interconnection patterns formed on the right of the intermediate patterns, wherein each of the left conductive interconnection patterns includes a flat right side surface and a rounded left side surface, and each of the right conductive interconnection patterns includes a flat left side surface and a rounded right side surface.

18. The method of claim 17, wherein each of the intermediate patterns includes both flat side surfaces, and each of the filling patterns includes both side surfaces that are rounded to have negative slopes where a bottom portion is narrow and a top portion is wide.

19. The method of claim 17, the sum of horizontal width of each left conductive interconnection pattern and horizontal width of each intermediate pattern is equal to a horizontal width of each first preliminary intermediate pattern.

20. The method of claim 17, wherein the sum of horizontal width of each right conductive interconnection pattern and horizontal width of each intermediate pattern is equal to a horizontal width of each first preliminary intermediate pattern.

* * * * *